(12) United States Patent
Xu et al.

(10) Patent No.: US 10,796,613 B2
(45) Date of Patent: Oct. 6, 2020

(54) FLEXIBLE DISPLAY DEVICE AND MANUFACTURING METHOD THEREFOR

(71) Applicant: KunShan Go-Visionox Opto-Electronics Co., Ltd., Kunshan (CN)

(72) Inventors: Gusheng Xu, Kunshan (CN); Yu Gu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/557,275

(22) Filed: Aug. 30, 2019

(65) Prior Publication Data

US 2019/0385491 A1    Dec. 19, 2019

Related U.S. Application Data

(63) Continuation of application No. PCT/CN2018/086519, filed on May 11, 2018.

(30) Foreign Application Priority Data

Aug. 31, 2017    (CN) .................. 2017 2 1111098 U

(51) Int. Cl.
| | |
|---|---|
| *G09F 9/30* | (2006.01) |
| *H01L 51/00* | (2006.01) |
| *H01L 51/52* | (2006.01) |
| *H01L 51/56* | (2006.01) |

(52) U.S. Cl.
CPC .......... *G09F 9/301* (2013.01); *H01L 51/0097* (2013.01); *H01L 51/529* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 10,355,246 B2 * | 7/2019 | Helander | H01L 51/529 |
| 2017/0062547 A1 | 3/2017 | Mathew et al. | |
| 2017/0229530 A1 | 8/2017 | Kawakami et al. | |

FOREIGN PATENT DOCUMENTS

| | | |
|---|---|---|
| CN | 1802069 A | 7/2006 |
| CN | 205406511 U | 7/2016 |
| CN | 205881905 U | 1/2017 |
| CN | 106940966 A | 7/2017 |
| CN | 106960850 A | 7/2017 |

OTHER PUBLICATIONS

PCT International Search Report dated Aug. 8, 2018 in International Application No. PCT/CN2018/086519.
International Search Authority, PCT Written Opinion of PCT/CN2018/086519 dated Aug. 8, 2018.

* cited by examiner

*Primary Examiner* — Vip Patel
(74) *Attorney, Agent, or Firm* — Rimon PC

(57) ABSTRACT

The present application discloses a flexible display device, which solves the problem that a flexible display module has poor bending property in the prior art. The flexible display device provided by the present application comprises a substrate, a supporting film, a buffer layer and a first heat dissipation layer. The supporting film, the buffer layer and the first heat dissipation layer are disposed on a first surface of the substrate in sequence, and a recess is provided on one or more layers of the supporting film, the buffer layer, and the first heat dissipation layer.

16 Claims, 9 Drawing Sheets

FLEXIBLE DISPLAY DEVICE AND MANUFACTURING METHOD THEREFOR

CROSS-REFERENCE TO RELATED APPLICATIONS

This application is a continuation of International Application No. PCT/CN2018/086519 filed on May 11, 2018, which claims priority to Chinese patent application No. 201721111098.3 filed on Aug. 31, 2017. Both applications are incorporated herein in their entireties by reference.

TECHNICAL FIELD

The present application relates to the field of flexible display technologies, particularly to a flexible display device and a manufacturing method therefor.

BACKGROUND

A flexible display device realizes display through an Organic Light Emitting Diode (OLED), which has the advantages of simple preparation process, high luminous efficiency, high contrast, low power consumption, good flexibility and foldability, and has attracted much attention in recent years. A flexible display module in the prior art mainly includes a substrate, and functional material layers like an OLED module, a polarizer, a touch panel, a protective film and the like that are sequentially superimposed on the substrate. In order to provide a certain stiffness to the flexible display module, a lower surface of the substrate is also attached with a supporting film to prevent warping and the like, and a foam under the supporting film plays a role in buffering the module. At the same time, in order to avoid the influence on the performance of the display module due to the high local temperature, a graphite sheet is often attached under the foam for heat dissipation. However, due to the large number of laminated layers and the large thickness, the flexible display module has a large overall stiffness when being bended and is not easy to be bended, the failure of a material or a screen body is easy to occur during bending, and thereby affecting the overall performance of the flexible display device. In particular, as thicker parts of a whole module, the bending performance of the supporting film, the foam and the graphite sheet under the screen body affects the final bendability of the whole module.

SUMMARY

In view of the above, the present application provides a flexible display device to solve the problem that a flexible display module has poor bending performance in the prior art.

One aspect of the present application provides a flexible display device, including a substrate, a supporting film, a buffer layer and a first heat dissipation layer. The supporting film, the buffer layer and the first heat dissipation layer are disposed on a first surface of the substrate in sequence, and a recess is provided on at least one of the supporting film, the buffer layer, and the first heat dissipation layer.

In an embodiment, the flexible display device further includes a bending line formed when the flexible display device is bent by a force, and the recess is provided along the bending line.

In an embodiment, the supporting film is made of a polyethylene terephthalate.

In an embodiment, the bending line is a straight line, the bending line is perpendicular to two opposite long sides of the supporting film, the buffer layer and the first heat dissipation layer, and the bending line is disposed at the middle of two opposite short sides of the supporting film, the buffer layer and the first heat dissipation layer.

In an embodiment, the recess includes a plurality of recess units dispersedly arranged along the bending line.

In an embodiment, the recess forms a curve pattern in a wave shape along the bending line on a surface of one or more layers of the supporting film, the buffer layer and the first heat dissipation layer.

In an embodiment, a curve in the curve pattern is one or more of a sinusoidal waveform curve, a triangular waveform curve, a diamond waveform curve, and an elliptical ring waveform curve.

In an embodiment, the flexible display device further includes a second heat dissipation layer attached to a surface of the first heat dissipation layer away from the buffer layer.

In an embodiment, a recess on the first heat dissipation layer is penetrating, the flexible display device further includes a reinforcing layer, and the reinforcing layer is disposed on a surface of the first heat dissipation layer away from the second heat dissipation layer and in the recess on the first heat dissipation layer.

In an embodiment, the reinforcing layer is further disposed in a recess on the buffer layer.

In an embodiment, a recess on the first heat dissipation layer and a recess on the buffer layer are both penetrating and have the same shape and position, the flexible display device further includes a reinforcing layer, and the reinforcing layer is disposed on a surface of the buffer layer away from the first heat dissipation layer, in the recess on the first heat dissipation layer, and the recess on the buffer layer.

In an embodiment, the buffer layer is made of a foam, the first heat dissipation layer is made of a graphite sheet, the second heat dissipation layer is made of a copper foil, and a material of the reinforcing layer is polyimide.

Another aspect of the present application provides a method for manufacturing a flexible display device, including: providing a substrate; disposing a supporting film, a buffer layer and a first heat dissipation layer on a first surface of the substrate in sequence; and providing a recess on at least one of the supporting film, the buffer layer, and the first heat dissipation layer.

In an embodiment, the method further includes: coating and curing a material for forming a reinforcing layer on a surface of the first heat dissipation layer; and coating the buffer layer on the material for forming the reinforcing layer so as to connect the first heat dissipation layer to the buffer layer through the material for forming the reinforcing layer.

In an embodiment, the method further includes: providing an adhesive and a second heat dissipation layer; and attaching the second heat dissipation layer to a surface of the first heat dissipation layer away from the buffer layer, so that the material for forming the reinforcing layer further flows into a recess on the first heat dissipation layer and infiltrates through the adhesive to contact with the second heat dissipation layer during a curing process, and thereby the buffer layer, the first heat dissipation layer and the second heat dissipation layer are integrally connected.

In an embodiment, the providing a recess on at least one of the supporting film, the buffer layer, and the first heat dissipation layer comprises providing a recess on the buffer layer and the first heat dissipation layer, and the method further includes: providing an adhesive and a second heat dissipation layer; attaching the second heat dissipation layer to a surface of the first heat dissipation layer away from the buffer layer; and coating and curing a material for forming a reinforcing layer on a surface of the buffer layer, so that the material for forming the reinforcing layer flows into a recess on the buffer layer and the first heat dissipation layer and further infiltrates downward through the adhesive to contact with the second heat dissipation layer during a curing process, and thereby the buffer layer, the first heat dissipation layer and the second heat dissipation layer are integrally connected.

In a flexible display device provided by the embodiments of the present application, a recess is provided on one or more layers of a supporting film, a buffer layer and a first heat dissipation layer, so that a stress accumulated in these functional layers is released more easily when the device is being bent, and thereby improving the bending performance of the device. In addition, as thicker parts of a whole module, the bending performance of the supporting film, the buffer layer and the first heat dissipation layer affect the final bendability of the whole module, so that the bending ability and reliability of the whole module can be improved by providing the recess on one or more layers of these functional layers.

DETAILED DESCRIPTION

In order to make the objects, technical means and advantages of the present application more comprehensible, the present application will be further described in detail below with reference to the accompanying drawings.

Figure 1:
FIG. 1 is a schematic structural diagram illustrating a flexible display device according to an embodiment of the present application.

FIG. 1 is a schematic structural diagram illustrating a flexible display device according to an embodiment of the present application. As shown in FIG. 1, the device includes a substrate 1, a supporting film 8, a buffer layer 9, a first heat dissipation layer 12, an OLED module 2, a polarizer 3, a touch panel 4 and a protective film 5. The supporting film 8, the buffer layer 9 and the first heat dissipation layer 12 are attached to a first surface of the substrate 1 in sequence, the OLED module 2, the polarizer 3, the touch panel 4 and the protective film 5 are disposed on a second surface of the substrate 1 in sequence, and the second surface is opposite to the first surface. As shown in FIG. 1, the first surface is a lower surface of the substrate 1, and the second surface is an upper surface. A recess (not shown in FIG. 1) is provided on one or more layers of the supporting film 8, the buffer layer 9 and the first heat dissipation layer 12.

The recess may be composed of a plurality of discrete recess units (for example, a circular recess unit), or may be a curved recess provided along a straight line, which is not limited by the present application. In addition, the recess may be penetrating or non-penetrating, such as a penetrating recess may be provided on the first heat dissipation layer 12, and a non-penetrating recess may be provided on the supporting film 8 and the buffer layer 9. The penetrating recess can not only facilitate the release of a stress accumulated in the first heat dissipation layer 12, but also improve the heat dissipation efficiency. Of course, the supporting film 8 and/or the buffer layer 9 may also be provided with a penetrating recess according to actual needs, which is not limited by the present application.

In a flexible display device provided by the embodiments of the present application, a recess is provided on one or more layers of a supporting film, a buffer layer and a first heat dissipation layer, so that a stress accumulated in these functional layers is released more easily when the device is being bent, and thereby improving the bending performance of the device. In addition, as thicker parts of a whole module, the bending performance of the supporting film, the buffer layer and the first heat dissipation layer affect the final bendability of the whole module, so that the bending ability and reliability of the whole module can be improved by providing the recess on one or more layers of these functional layers.

In a preferred embodiment of the present application, the recess is provided along a bending line. The bending line is generally provided in a non-display area of the flexible display device, such as at a position in the middle of the flexible display device or near a certain edge of the flexible display device, etc. The specific position of the bending line is not limited by the present application. Referring to FIG. 2(a) to FIG. 2(e), the setting position and shape of the recess will be described specifically below based on the supporting film 8, taking the bending line 10 as an example, which is a straight line perpendicular to two opposite long sides and at the middle of two opposite short sides of the support film 8 on the device. It can be understood by those skilled in the art that since the bending of a screen body generally begins along the straight line when a force is applied, providing the recess along the bending line 10 is more advantageous for the improvement of the bending performance of the supporting film 8.

Figure 2:
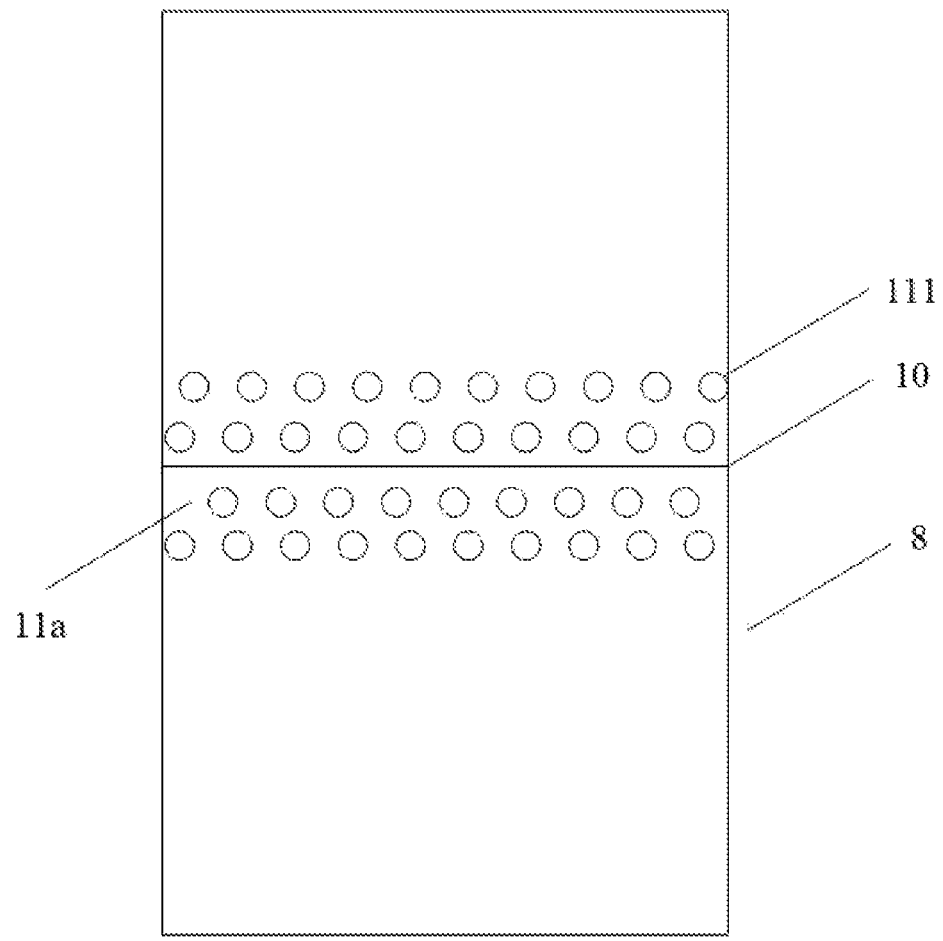
FIG. 2(a) is a top view illustrating a supporting film in a flexible display device according to an embodiment of the present application.
FIG. 2(b) is a top view illustrating a supporting film in a flexible display device according to another embodiment of the present application.
FIG. 2(c) is a top view illustrating a supporting film in a flexible display device according to another embodiment of the present application.
FIG. 2(d) is a top view illustrating a supporting film in a flexible display device according to another embodiment of the present application.
FIG. 2(e) is a top view illustrating a supporting film in a flexible display device according to another embodiment of the present application.
Figure 2:
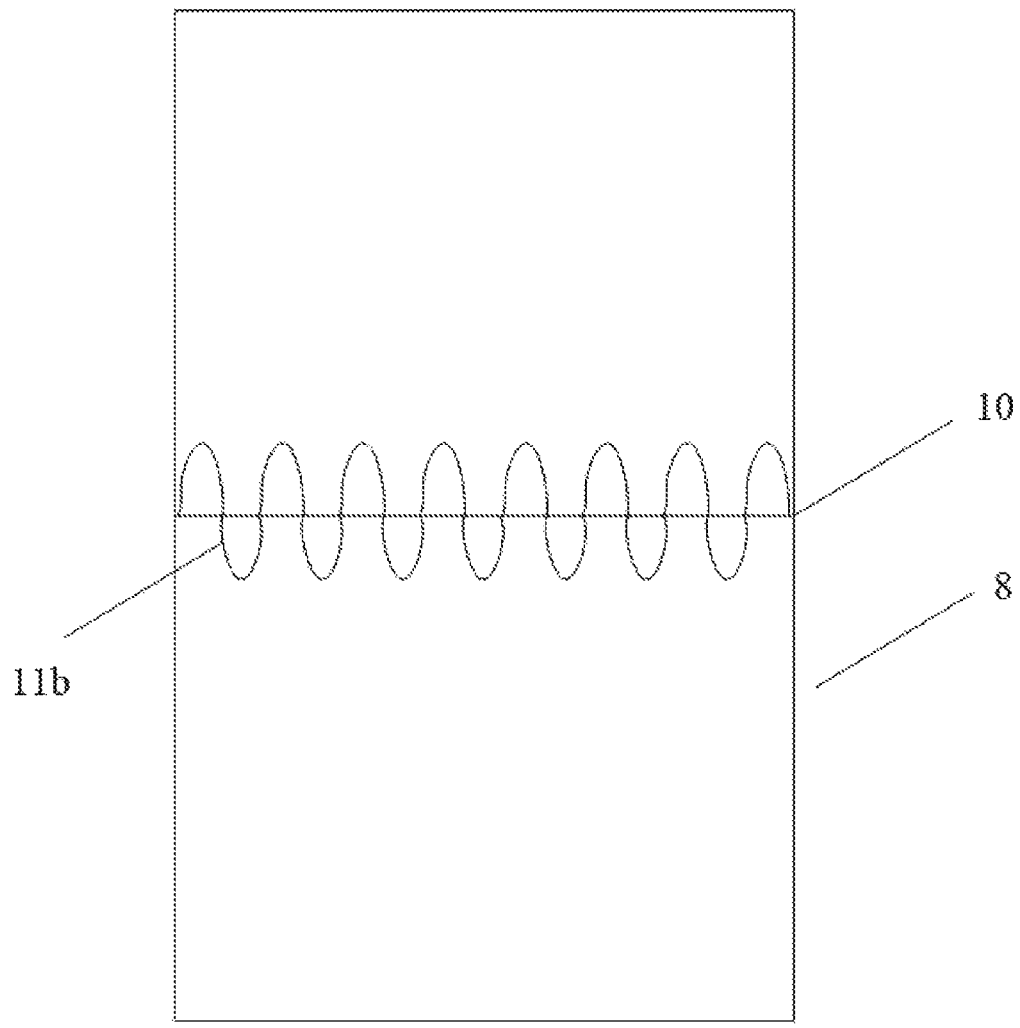
Figure 2:
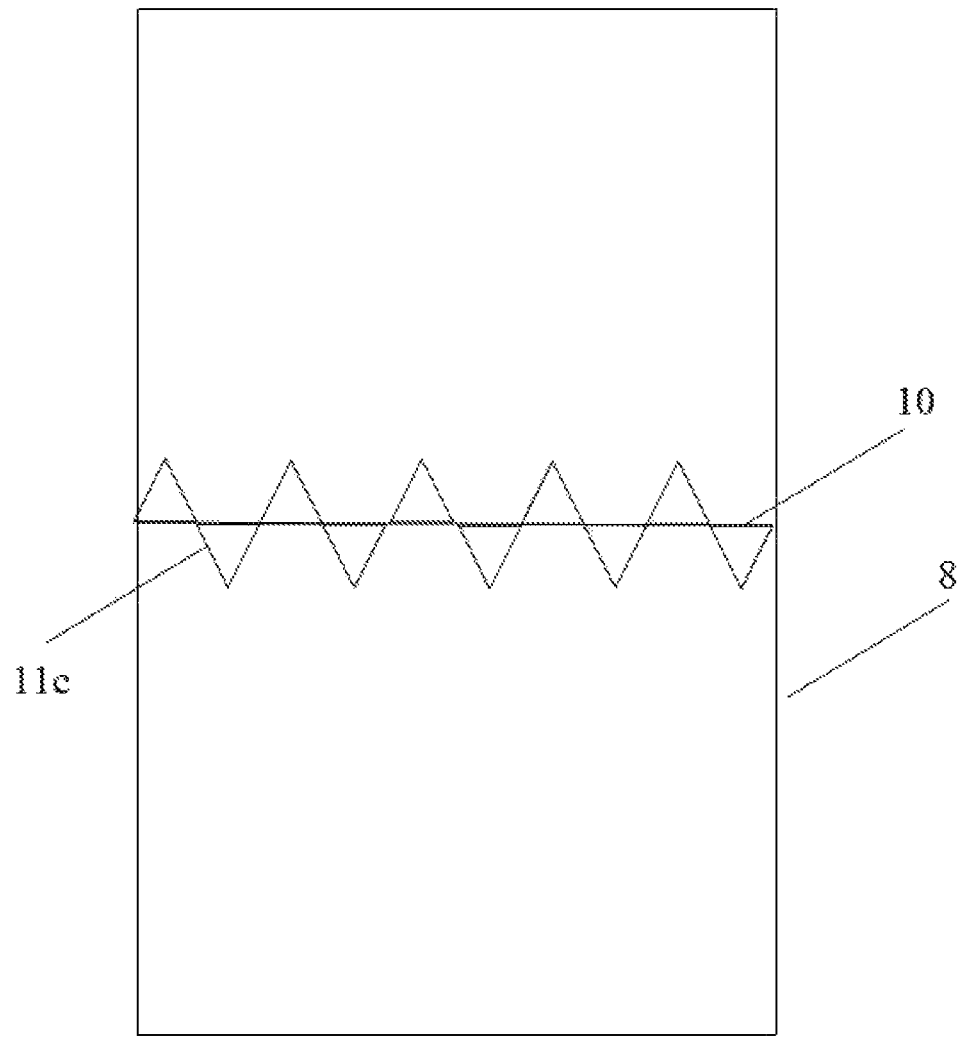
Figure 2:
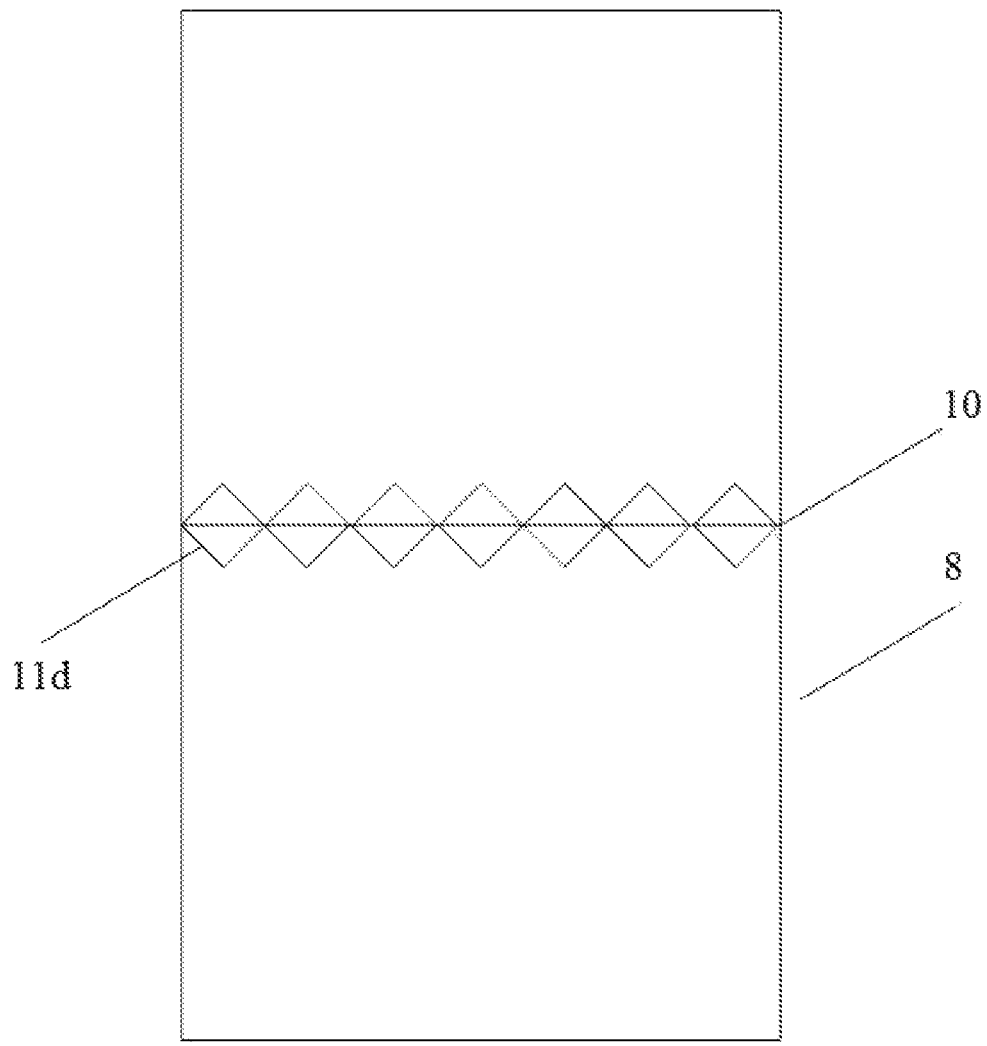
Figure 2:
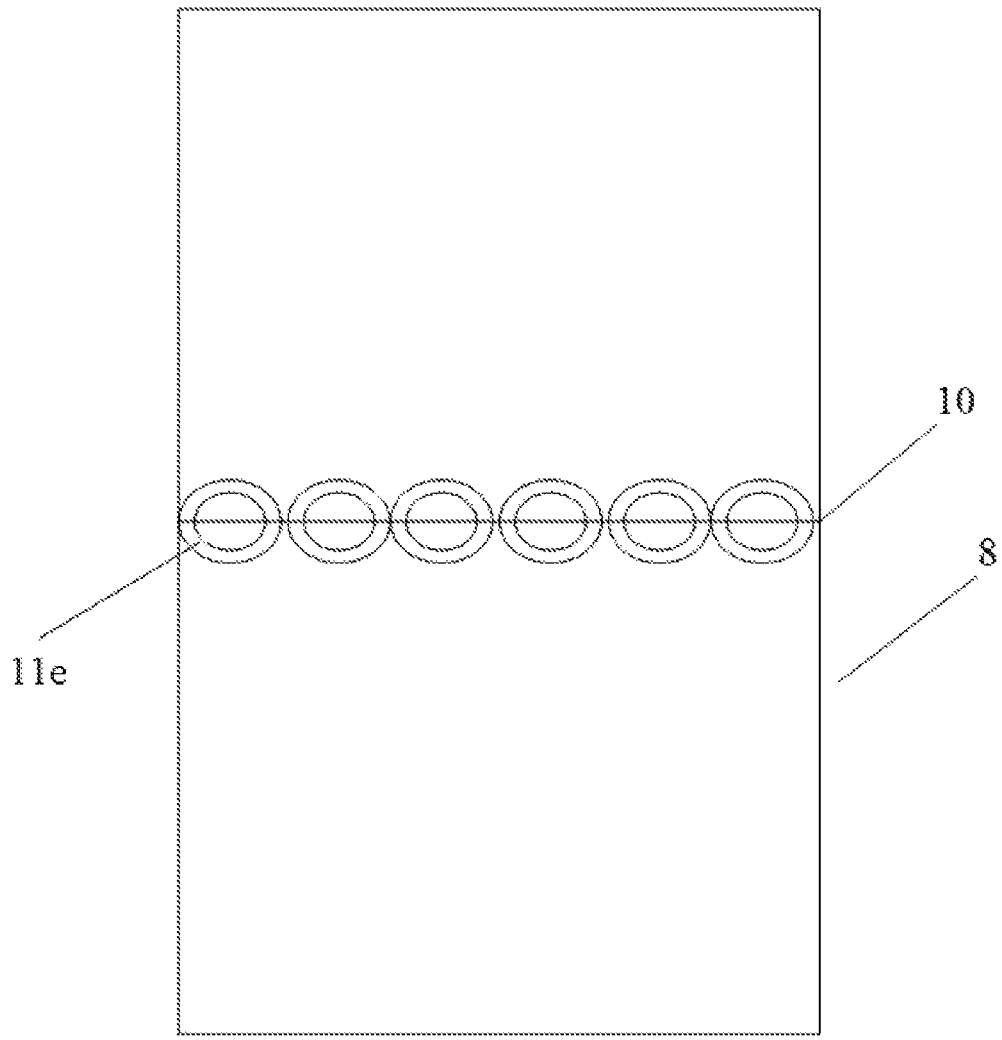

For a recess, it may specifically include a plurality of recess units arranged in a dispersed manner. Referring to FIG. 2(a), the plurality of recess units 111 are dispersedly arranged along the bending line 10 to form a recess 11a, and the pattern formed by the recess unit 111 on a surface of the supporting film 8 may be a circle, an ellipse, a triangle, or any other polygon.

Referring to FIG. 2(b) to FIG. 2(e), the pattern formed on the surface of the supporting film 8 may also be a curve having a wave shape along the bending line 10, and the curve may specifically be one or more of a sinusoidal waveform curve, a triangular waveform curve, a diamond waveform curve, or an elliptical ring waveform curve. For example, a recess 11b with a sinusoidal waveform curve as shown in FIG. 2(b), a recess 11c with a triangular waveform curve as shown in FIG. 2(c), and a recess 11d with a diamond waveform curve as shown in FIG. 2(d), a recess 11e with an elliptical ring waveform curve as shown in FIG. 2(e) and the like. That is to say, as long as a recess is provided along the bending line 10 and may play a role of dispersing the stress, the shape of the recess is not specifically limited by the present application. The thickness of the curve formed by the recess on the surface of the supporting film 8 represents the width of the recess, which may also be set differently according to actual needs.

In addition, in order to better disperse the stress accumulated in the supporting film 8, more recesses may be provided at other positions away from the bending line 10 to further enhance the bending performance of the supporting film 8.

For the buffer layer 9 and the first heat dissipation layer 12, the design thought of the position of a bending line and the position and shape of a recess are the same as those of the above-mentioned supporting film 8, and will not be described herein. Those skilled in the art may arrange a recess on one or more layers of the supporting film 8, the buffer layer 9, and the first heat dissipation layer 12 according to specific needs. When those functional layers are provided with recesses, the positions and shapes thereof may be set to be the same or different, which is not limited by the present application.

For the material of the supporting film 8, it may be an antistatic, stiff and certain bendable material such as polyethylene terephthalate (abbreviation: PET). For the material of the buffer layer 9, for example, it may be a foam, which can play a good role in buffering a whole display module. For the material of the first heat dissipation layer 12, for example, it may be a graphite sheet, which has better heat dissipation and heat homogenization function, can avoid the influence on the performance of the display module due to the high local temperature, and thereby prolonging the service life of the device.

In a flexible display device provided by the embodiments of the present application, a recess is provided in a fluctuating curved shape or a form of a plurality of recess units arranged dispersedly, which is more advantageous for the release of stress in a supporting film, a buffer layer and/or a first heat dissipation layer 12 when a screen body is bent. In addition, since the bending of the screen body generally begins along a bending line when the force is applied, the bending performance of the supporting film, the buffer layer and/or the first heat dissipation layer 12 is further improved by providing the recess near the bending line in the present embodiment, which is more conducive to the enhancement of the bending performance and reliability of the whole module.

Figure 3:
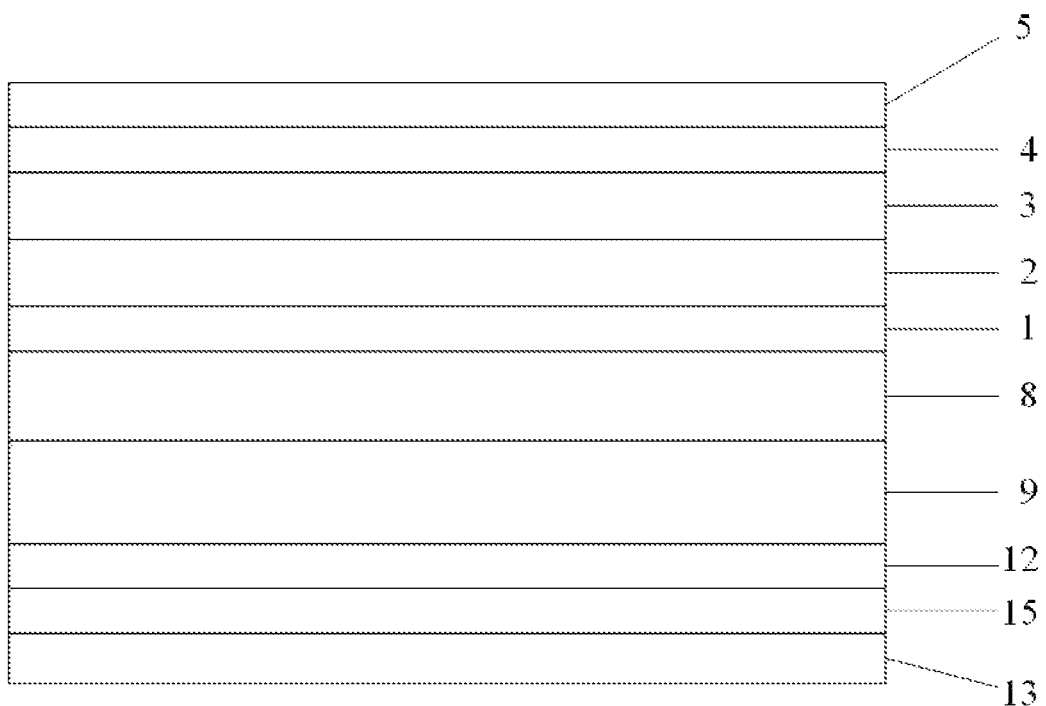
FIG. 3 is a schematic structural diagram illustrating a flexible display device according to another embodiment of the present application.

In an embodiment of the present application, as shown in FIG. 3, the flexible display device further includes a second heat dissipation layer 13, and the second heat dissipation layer 13 is attached to a surface of the first heat dissipation layer 12 away from the buffer layer 9. Specifically, the first heat dissipation layer 12 and the second heat dissipation layer 13 may be bonded by an adhesive 15. For the adhesive 15, for example, a pressure sensitive adhesive (abbreviation: PSA) or an optical adhesive (abbreviation: OCA) may be selected.

In an embodiment, the first heat dissipation layer 12 is specifically made of a graphite sheet, and the second heat dissipation layer 13 is made of a copper foil. It can be understood by those skilled in the art that the heat dissipation effect of the graphite sheet in a vertical direction is better, while the heat dissipation effect of the copper foil in a horizontal direction is better, so the combination of the two may achieve a good heat dissipation effect for the whole module. In addition, the copper foil also has an electromagnetic shielding function, which may shield the external electromagnetic interference.

Figure 4:
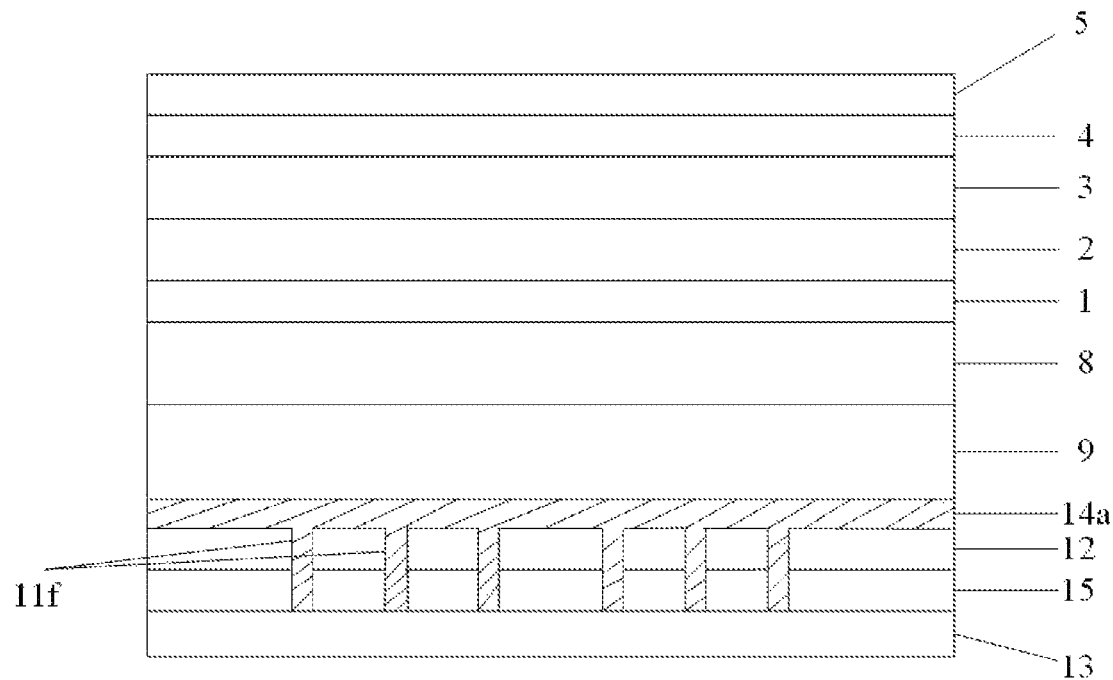
FIG. 4 is a cross-sectional view illustrating a flexible display device according to another embodiment of the present application.

However, when the first heat dissipation layer 12 is made of the graphite sheet, it has poor adhesion to other functional layers, especially when bending or high temperature experiments, with the decrease of the viscosity of the adhesive, the separation between the graphite sheet and the copper foil is liable to occur. To solve this problem, as shown in FIG. 4, it is a cross-sectional view cut perpendicularly to the buffer layer 9 illustrating a flexible display device according to an embodiment. As may be seen from FIG. 4, a recess is provided on the first heat dissipation layer 12, and is penetrating, while no recess is provided on the buffer layer 9. The flexible display device further includes a reinforcing layer 14a disposed on a surface of the first heat dissipation layer 12 away from the second heat dissipation layer 13 and in a recess 11f of the first heat dissipation layer 12. The reinforcing layer 14a is made of a flexural organic material with high temperature resistant. In a preferred embodiment, the material is polyimide (abbreviation: PI). Specifically, PI may be coated on the surface of the first heat dissipation layer 12 (graphite sheet) and cured, then the buffer layer 9 is continuously attached to the PI, and the graphite sheet is tightly connected to the buffer layer 9 by PI. In addition, the PI may further flow downward into the recess 11f of the graphite sheet, and infiltrate through the adhesive 15 to contact with the lowermost copper foil during a curing process, and thereby the buffer layer 9, the graphite sheet, and the copper foil below are integrally connected. Because the bending performance and high temperature resistance of PI are very strong, the whole module does not delaminate during bending or high temperature experiments, which ensures the heat dissipation performance and bending ability of the device.

Figure 5:
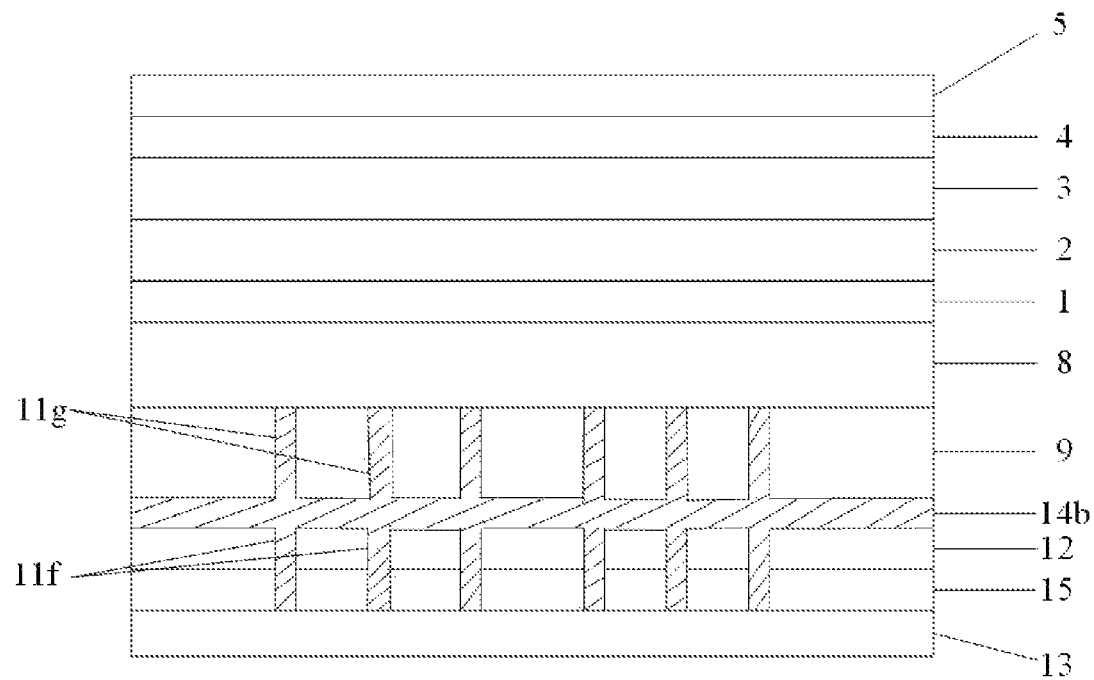
FIG. 5 is a cross-sectional view illustrating a flexible display device according to another embodiment of the present application.

In another embodiment, as shown in FIG. 5, a recess 11g is provided on the buffer layer 9, and may be penetrating or non-penetrating, which is not limited by the present application. A reinforcing layer 14b is disposed not only on the surface of the first heat dissipation layer 12 away from the second heat dissipation layer 13 and in the recess 11f, but also in the recess 11g of the buffer layer 9. That is, in the present embodiment, since the buffer layer 9 has a recess structure, the PI may not only infiltrate downward through the recess 11f of the graphite sheet, but also infiltrate upward through the recess 11g of the buffer layer 9 during the curing process, and thereby the graphite sheet and the buffer layer 9 are connected more closely.

Figure 6:
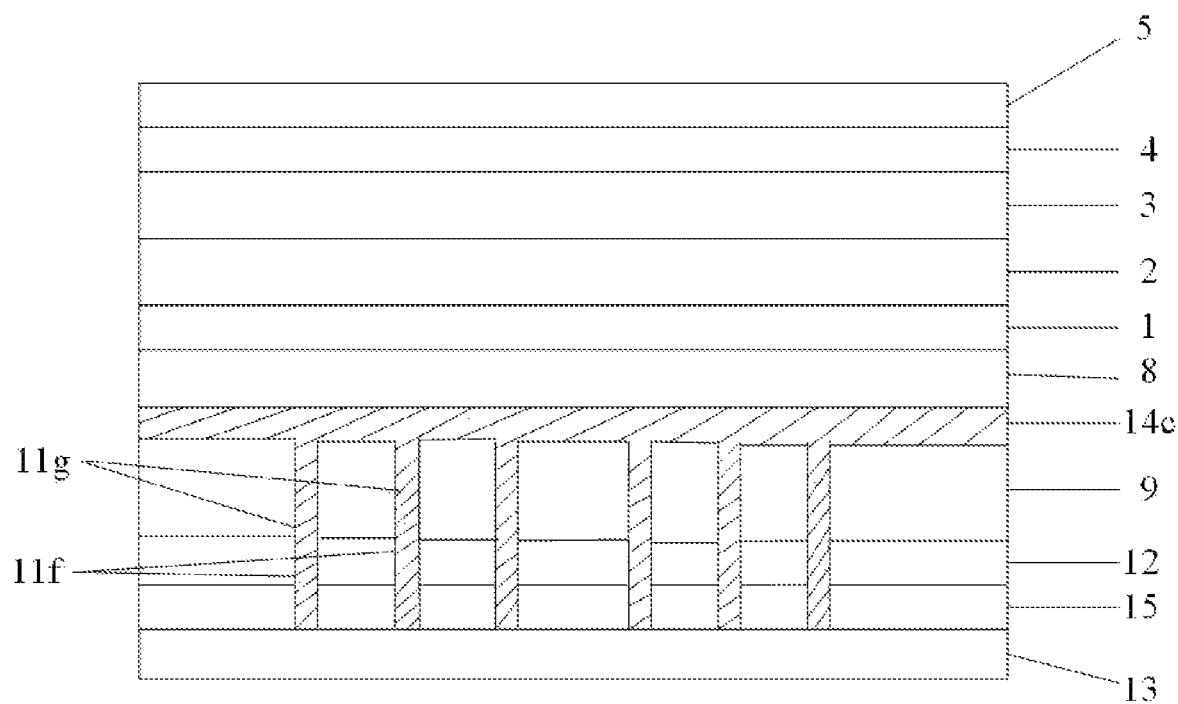
FIG. 6 is a cross-sectional view illustrating a flexible display device according to another embodiment of the present application.

In another embodiment of the present application, the recess 11f on the first heat dissipation layer 12 and the recess 11g on the buffer layer 9 are both penetrating and identical in shape and position. As shown in FIG. 6, The flexible display device further includes a reinforcing layer 14c disposed on a surface of the buffer layer 9 away from the first heat dissipation layer 12, in the recess 11g of the buffer layer 9 and in the recess 11f of the first heat dissipation layer 12. Specifically, PI may be coated on the surface of the buffer layer 9 (such as a foam) and cured, then the PI flows into the recess 11g and the recess 11f, and further infiltrates downward through the adhesive 15 to contact with the lowermost copper foil during a curing process. Thus the buffer layer 9, the graphite sheet, and the copper foil are integrally connected to form an integral body, and the delamination can not be occurred during bending or high temperature experiments, which ensures the heat dissipation performance and bending ability of the device.

Of course, in order to enable the buffer layer 9 and the first heat dissipation layer 12 to accommodate more PI, in addition to allowing the PI naturally flow into the recesses of both, it is also possible to directly fill the PI in the recesses, and thereby the closeness between each other is further strengthened.

In a flexible display device provided by the embodiments of the present application, the design of a copper foil is added, which has a good heat dissipation effect on the device combining with a graphite sheet. In addition, a penetrating recess is provided on the graphite sheet, and a reinforcing layer is added on a surface of a buffer layer or the graphite sheet. The reinforcing layer material can infiltrate through the adhesive to contact with the copper foil through the recess during a curing process, and thereby the graphite sheet, the buffer layer, and the copper foil are tightly connected to form an integral body. Therefore, the whole module does not delaminate during bending or high temperature experiments, and further ensuring the heat dissipation performance and bending ability of the device.

The above are only the preferred embodiments of the present application and are not intended to limit the protection scope of the present application. Any modifications, equivalent substitutions, improvements, etc. made within the spirit and principle of the present application should be included within the protection scope of the present application.

What is claimed is:

1. A flexible display device, comprising: a substrate, a supporting film, a buffer layer, a reinforcing layer, and a first heat dissipation layer,
    wherein the supporting film, the buffer layer and the first heat dissipation layer are disposed on a first surface of the substrate in sequence, and a recess is provided on at least one of the supporting film, the buffer layer, and the first heat dissipation layer;
    wherein the recess is filled with a material of the reinforcing layer.

2. The flexible display device according to claim 1, further comprising a bending line formed when the flexible display device is bent by a force, wherein the recess is provided along the bending line.

3. The flexible display device according to claim 1, wherein the supporting film is made of a polyethylene terephthalate.

4. The flexible display device according to claim 2, wherein the bending line is a straight line, the bending line is perpendicular to two opposite long sides of the supporting film, the buffer layer and the first heat dissipation layer, and the bending line is disposed at the middle of two opposite short sides of the supporting film, the buffer layer and the first heat dissipation layer.

5. The flexible display device according to claim 2, wherein the recess comprises a plurality of recess units dispersedly arranged along the bending line.

6. The flexible display device according to claim 2, wherein the recess forms a curve pattern in a wave shape along the bending line on a surface of one or more layers of the supporting film, the buffer layer and the first heat dissipation layer.

7. The flexible display device according to claim 6, wherein a curve in the curve pattern is one or more of a sinusoidal waveform curve, a triangular waveform curve, a diamond waveform curve, and an elliptical ring waveform curve.

8. The flexible display device according to claim 1, further comprising a second heat dissipation layer attached to a surface of the first heat dissipation layer away from the buffer layer.

9. The flexible display device according to claim 8, wherein a recess on the first heat dissipation layer is penetrating, and the reinforcing layer is disposed on a surface of the first heat dissipation layer away from the second heat dissipation layer and in the recess on the first heat dissipation layer.

10. The flexible display device according to claim 9, wherein the reinforcing layer is further disposed in a recess on the buffer layer.

11. The flexible display device according to claim 8, wherein a recess on the first heat dissipation layer and a recess on the buffer layer are both penetrating and have the same shape and position, and the reinforcing layer is disposed on a surface of the buffer layer away from the first heat dissipation layer, in the recess on the first heat dissipation layer, and the recess on the buffer layer.

12. The flexible display device according to claim 9, wherein the buffer layer is made of a foam, the first heat dissipation layer is made of a graphite sheet, the second heat dissipation layer is made of a copper foil, and a material of the reinforcing layer is polyimide.

13. A method for manufacturing a flexible display device, comprising:
    providing a substrate;
    disposing a supporting film, a buffer layer, a reinforcing layer, and a first heat dissipation layer on a first surface of the substrate in sequence; and
    providing a recess on at least one of the supporting film, the buffer layer, and the first heat dissipation layer,
    wherein a material of the reinforcing layer fills the recess.

14. The method according to claim 13, further comprising:
    coating and curing the material for forming the reinforcing layer on a surface of the first heat dissipation layer; and
    coating the buffer layer on the material for forming the reinforcing layer so as to connect the first heat dissipation layer to the buffer layer through the material for forming the reinforcing layer.

15. The method according to claim 14, further comprising:
    providing an adhesive and a second heat dissipation layer; and
    attaching the second heat dissipation layer to a surface of the first heat dissipation layer away from the buffer layer, so that the material for forming the reinforcing layer further flows into a recess on the first heat dissipation layer and infiltrates through the adhesive to contact with the second heat dissipation layer during a curing process, and thereby the buffer layer, the first heat dissipation layer and the second heat dissipation layer are integrally connected.

16. The method according to claim 13, wherein the providing a recess on at least one of the supporting film, the buffer layer, and the first heat dissipation layer comprises providing a recess on the buffer layer and the first heat dissipation layer, and the method further comprises:
providing an adhesive and a second heat dissipation layer;
attaching the second heat dissipation layer to a surface of the first heat dissipation layer away from the buffer layer; and
coating and curing the material for forming the reinforcing layer on a surface of the buffer layer, so that the material for forming the reinforcing layer flows into a recess on the buffer layer and the first heat dissipation layer and further infiltrates downward through the adhesive to contact with the second heat dissipation layer during a curing process, and thereby the buffer layer, the first heat dissipation layer and the second heat dissipation layer are integrally connected.

* * * * *